United States Patent
Baek et al.

(10) Patent No.: US 7,585,729 B2
(45) Date of Patent: Sep. 8, 2009

(54) METHOD OF MANUFACTURING A NON-VOLATILE MEMORY DEVICE

(75) Inventors: Sung-Kweon Baek, Suwon-si (KR);
Bon-Young Koo, Suwon-si (KR);
Chul-Sung Kim, Seongnam-si (KR);
Jung-Geun Jee, Seoul (KR); Young-Jin Noh, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 145 days.

(21) Appl. No.: 11/868,195

(22) Filed: Oct. 5, 2007

(65) Prior Publication Data

US 2008/0090354 A1    Apr. 17, 2008

(30) Foreign Application Priority Data

Oct. 12, 2006    (KR)    .............. 10-2006-0099397

(51) Int. Cl.
*H01L 21/00*    (2006.01)
(52) U.S. Cl. ............. 438/261; 438/264; 438/769
(58) Field of Classification Search ......... 438/261, 438/264, 769
See application file for complete search history.

(56) References Cited

U.S. PATENT DOCUMENTS

2007/0167030 A1*   7/2007   Jee et al. ............ 438/769
2008/0085583 A1*   4/2008   Park et al. ............ 438/261
2008/0085584 A1*   4/2008   Noh et al. ............ 438/264
2008/0090354 A1*   4/2008   Baek et al. ............ 438/264
2008/0105915 A1*   5/2008   Park et al. ............ 257/314

FOREIGN PATENT DOCUMENTS

| KR | 1019970009863 | 6/1997 |
| KR | 2002-261097 | 9/2002 |
| KR | 10-0471405 | 2/2005 |

OTHER PUBLICATIONS

English Abstract for Publication No. 1019970009863.
English Abstract for Publication No. 2002-261097.
English Abstract for Publication No. 10-0471405.

* cited by examiner

*Primary Examiner*—Laura M Menz
(74) *Attorney, Agent, or Firm*—F. Chau & Associates, LLC

(57) ABSTRACT

A method of manufacturing a non-volatile memory device, includes forming a tunnel isolation layer comprising an oxynitride on a substrate by a simultaneous oxidation and nitridation treatment in which an oxidation process and a nitridation process are simultaneously performed using a processing gas including oxygen and nitrogen. The method further includes performing first and second heat treatments to remove defect sites from the tunnel isolation layer in gas atmospheres including nitrogen (N) and chlorine (Cl), respectively and forming a gate structure on the tunnel isolation layer after the second heat treatment, and forming source/drain regions at surface portions of the substrate adjacent to the gate structure.

33 Claims, 9 Drawing Sheets

METHOD OF MANUFACTURING A NON-VOLATILE MEMORY DEVICE

CROSS-REFERENCE TO RELATED APPLICATIONS

This application claims priority under 35 U.S.C. §119 to Korean Patent Application No. 2006-99397, filed on Oct. 12, 2006, the disclosure of which is hereby incorporated by reference herein in its entirety.

BACKGROUND OF THE INVENTION

1. Technical Field

The present disclosure relates to a method of manufacturing a non-volatile memory device, and more particularly, to a method of manufacturing a flash memory device having a tunnel insulation layer.

2. Description of the Related Art

Semiconductor memory devices, in general, are classified as either volatile or non-volatile memory devices. Volatile memory devices such as, for example, dynamic random access memory (DRAM) devices and static random access memory (SRAM) devices have relatively high input/output (I/O) speeds, and may lose data stored therein when power is shut off. In contrast, non-volatile memory devices such as, for example, read-only memory (ROM) devices have relatively slow I/O speeds, and may be able to maintain data stored therein even when the power is shut off. Additionally, the demand for non-volatile memory devices, such as electrically erasable programmable ROM (EEPROM) devices or flash EEPROM devices is increasing.

In a flash EEPROM device, data is electrically stored, e.g., programmed or erased, through a Fowler-Nordheim (F-N) tunneling mechanism and/or a channel hot electron injection mechanism. The flash memory device are generally classified as either a floating gate type or a charge trap type such as, for example, silicon-oxide-nitride-oxide semiconductor (SONOS) devices or metal-oxide-nitride-oxide semiconductor (MONOS) devices.

The floating gate type flash memory device typically includes a gate structure and source/drain regions on a semiconductor substrate. The gate structure includes a tunnel insulation layer, a floating gate electrode, a blocking layer and a control gate electrode. The tunnel insulation layer includes a silicon oxide layer formed by a thermal oxidation process, and the blocking layer includes a dielectric multilayer in which a lower silicon oxide layer, a silicon nitride layer and an upper silicon oxide layer are sequentially stacked. The floating gate electrode and the control gate electrode comprise polysilicon doped with impurities.

The charge trap type flash memory device includes a tunnel insulation layer on a channel region of a semiconductor substrate, a charge trapping layer for trapping electrons from the channel region, a blocking layer on the charge trap layer, and a gate electrode on the dielectric layer and spacers on sidewalls of the gate electrode.

The operation of the flash memory device includes stable repetition of charging and discharging electrons through the tunnel insulation layer, and thus electronic characteristics of the tunnel insulation layer may have a significant effect on the reliability of the flash memory device. For that reason, various types of research have been performed on improving the electronic characteristics of the tunnel insulation layer.

Injection of nitrogen (N) into a silicon oxide layer is generally known to minimize layer failures, such as layer defects or trap sites, because silicon (Si) atoms of the silicon oxide layer are chemically combined with nitrogen (N) atoms. Further, electrical shocks to the silicon oxide layer are also minimized in the charging and discharging of the electrons through the tunnel insulation layer because the bond energy of silicon (Si) and nitrogen (N) is much greater than that of silicon (Si) and oxygen (O). To inject nitrogen (N) atoms into a silicon oxide layer, a nitric oxide (NO) heat treatment process is typically performed on the silicon oxide layer after completing the formation of the silicon oxide layer.

However, the NO heat treatment after the formation of the silicon oxide layer distributes the nitrogen (N) atoms around a top surface of the silicon oxide layer, to thereby cause non-uniformity of nitrogen (N) atoms in a vertical direction through the silicon oxide layer. The non-uniformity of nitrogen (N) atoms through the silicon oxide layer may deteriorate the electrical characteristics of the tunnel insulation layer, which in turn may cause, for example, room temperature charge loss, thereby resulting the deterioration of the reliability of the flash memory device.

SUMMARY OF THE INVENTION

Exemplary embodiments of the present invention provide a method of manufacturing a non-volatile memory device having a tunnel insulation layer of which electrical characteristics are improved.

In accordance with an exemplary embodiment of the present invention, a method of manufacturing a non-volatile memory device is provided. The method includes forming a tunnel isolation layer comprising an oxynitride on a substrate by a simultaneous oxidation and nitridation treatment in which an oxidation process and a nitridation process are simultaneously performed using a processing gas including oxygen and nitrogen. The method further includes performing a first heat treatment in a first gas atmosphere including nitrogen (N), to thereby remove defect sites from the tunnel isolation layer. The residual defect sites remain in the tunnel isolation layer after the first heat treatment. In addition, the method includes performing a second heat treatment in a second gas atmosphere including chlorine (Cl), to thereby remove the residual defect sites from the tunnel isolation layer, forming a gate structure on the tunnel isolation layer after the second heat treatment, and forming source/drain regions at surface portions of the substrate adjacent to the gate structure.

As an exemplary embodiment of the present invention, the processing gas includes one selected from the group consisting of oxygen ($O_2$), ozone ($O_3$) and water vapor ($H_2O$), and includes any one selected from the group consisting of nitrogen ($N_2$), ammonia ($NH_3$), nitric oxide (NO) and nitrous oxide ($N_2O$). For example, the processing gas may include oxygen ($O_2$) and nitric oxide (NO), and a flux ratio of the oxygen ($O_2$) and the nitric oxide (NO) is in a range of about 1:0.01 to about 1:0.2. The processing gas may further include hydrogen ($H_2$) gas.

As an exemplary embodiment of the present invention, the simultaneous oxidation and nitridation treatment is performed at a temperature of about 800° C. to about 1,100° C.

As an exemplary embodiment of the present invention, the processing gas includes plasma, and the simultaneous oxidation and nitridation treatment is performed using oxygen radicals and nitrogen radicals.

As an exemplary embodiment of the present invention, the first gas atmosphere for the first heat treatment includes any one selected from the group consisting of nitrogen ($N_2$), nitric oxide (NO), nitrous oxide ($N_2O$) and ammonia ($NH_3$). For example, the first heat treatment may be performed using a second processing gas including nitrogen (N$_2$) and nitric oxide (NO), and a flux ratio of the nitrogen (N$_2$) and nitric oxide (NO) is in a range of about 1:0.01 to about 1:0.2.

As an exemplary embodiment of the present invention, the first heat treatment is performed at a temperature of about 800° C. to about 1,100° C.

As an exemplary embodiment of the present invention, the second gas atmosphere for the second heat treatment includes hydrogen chloride (HCl) and any one selected from the group selected from the group consisting oxygen (O$_2$), ozone (O$_3$) and water vapor (H$_2$O). For example, the second heat treatment may be performed using a second processing gas including oxygen (O$_2$) and hydrogen chloride (HCl), and a flux ratio of the oxygen (O$_2$) and the hydrogen chloride (HCl) is in a range of about 1:0.001 to about 1:0.1.

As an exemplary embodiment of the present invention, the second heat treatment is performed at a temperature of about 800° C. to about 1.100° C.

As an exemplary embodiment of the present invention, performing the first heat treatment and forming the tunnel isolation layer are performed in-situ with each other.

As an exemplary embodiment of the present invention, performing the first heat treatment and performing the second heat treatment are performed in-situ with each other.

As an exemplary embodiment of the present invention, forming the tunnel isolation layer, performing the first heat treatment and performing the second heat treatment are performed in-situ with one another.

As an exemplary embodiment of the present invention, the gate structure may be formed through the following steps. A floating gate pattern is formed on the tunnel isolation layer on which the second heat treatment is performed, and a blocking layer is formed on the floating gate pattern. A control gate conductive layer is formed on the blocking layer, and the control gate conductive layer, the blocking layer, the floating gate pattern and the tunnel isolation layer are sequentially patterned.

As an exemplary embodiment of the present invention, the blocking layer includes a lower dielectric layer, a middle dielectric layer and an upper dielectric layer. The lower and upper dielectric layers include silicon oxide, respectively, and the middle dielectric layer includes silicon nitride or a metal oxide having a dielectric constant greater than the silicon nitride. The metal oxide includes at least one selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

As an exemplary embodiment of the present invention, the gate structure may be formed through the following steps. A trapping layer is formed on the tunnel isolation layer on which the second heat treatment is performed. The trapping layer traps electrons from a channel region of the substrate. A blocking layer is formed on the trapping layer, and a conductive layer is formed on the blocking layer. The conductive layer, the blocking layer, the trapping layer and the tunnel isolation layer are sequentially patterned.

As an exemplary embodiment of the present invention, the trapping layer includes silicon nitride or a first material having a dielectric constant greater than the silicon nitride. The first material includes one of a metal oxide, a metal oxynitride, a metal silicon oxide and a metal silicon oxynitride. The first material includes at least one selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

As an exemplary embodiment of the present invention, the blocking layer includes a second material of which a dielectric constant is greater than those of silicon oxide, silicon oxynitride and silicon nitride. The second material includes one of a metal oxide, a metal oxynitride, a metal silicon oxide and a metal silicon oxynitride. The second material includes at least one selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

As an exemplary embodiment of the present invention, the gate structure may be formed through the following steps. A trapping layer is formed on the tunnel isolation layer on which the second heat treatment is performed. The trapping layer traps electrons from a channel region of the substrate. A blocking layer is formed on the trapping layer, and a conductive layer is formed on the blocking layer. A gate electrode is formed by patterning the conductive layer, and the blocking layer, the trapping layer and the tunnel isolation layer are sequentially patterned. A spacer may be further formed on a sidewall of the gate electrode, and the step of patterning the blocking layer, the trapping layer and the tunnel isolation layer is performed by an etching process using the spacer as an etching mask.

According to exemplary embodiments of the present invention, an oxidation treatment and a nitridation treatment are simultaneously performed to thereby improve the uniformity of nitrogen concentration in a tunnel isolation layer and improve electrical characteristics of the tunnel isolation layer. Further, defect sites of the tunnel isolation layer may be removed by first and second heat treatments thereto, to thereby sufficiently improve the reliability of a non-volatile memory device.

In accordance with an exemplary embodiment of the present invention, a method of manufacturing a non-volatile memory device is provided. The method includes forming an oxide pattern and a mask pattern that are stacked on a substrate, forming a trench in the substrate, forming a field isolation pattern in the trench located in the substrate and removing the oxide pattern and the mask pattern from the substrate by an etching process to thereby form an opening through which an active region of the substrate is exposed. The method further includes forming a tunnel isolation layer comprising an oxynitride on the active region of the substrate by a simultaneous oxidation and nitridation treatment in which an oxidation process and a nitridation process are simultaneously performed using a processing gas including oxygen and nitrogen, performing a first heat treatment in a first gas atmosphere including nitrogen (N), to thereby remove defect sites from the tunnel isolation layer and performing a second heat treatment in a second gas atmosphere including chlorine (Cl), to thereby remove residual defect sites remaining after the first heat treatment from the tunnel isolation layer. Moreover, the method further includes forming a gate structure on the tunnel isolation layer after the second heat treatment and forming source/drain regions at surface portions of the substrate adjacent to the gate structure.

BRIEF DESCRIPTION OF THE DRAWINGS

Exemplary embodiments of the present invention can be understood in more detail from the following description when taken in conjunction with the accompanying drawings, in which.

DETAILED DESCRIPTION OF THE EXEMPLARY EMBODIMENTS OF THE INVENTION

Figure 1:
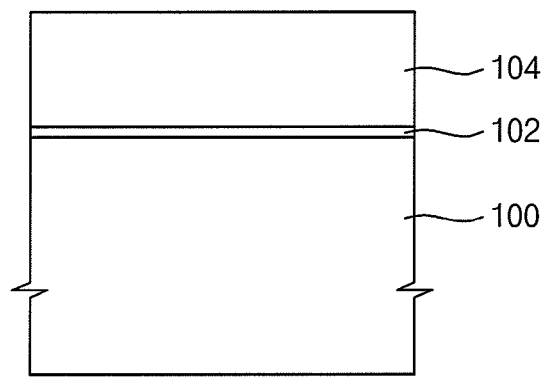
FIGS. 1 to 6 and FIGS. 8 to 12 are cross-sectional views illustrating a method of manufacturing a non-volatile memory device in accordance with an exemplary embodiment of the present invention.

In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIGS. 1 to 6 and FIGS. 8 to 12 are cross-sectional views illustrating a method of manufacturing a non-volatile memory device in accordance with an exemplary embodiment of the present invention.

Figure 10:
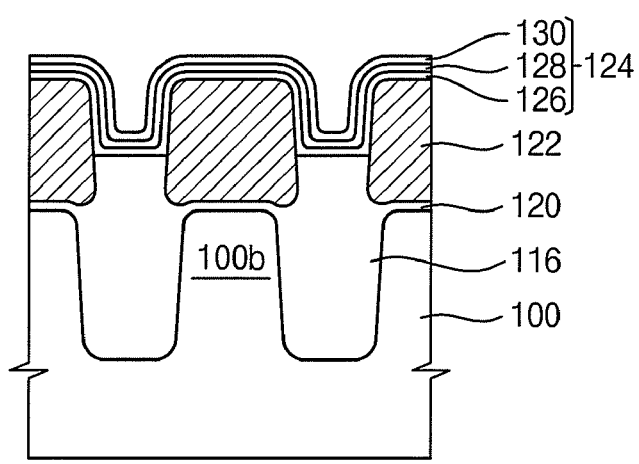
Figure 11:
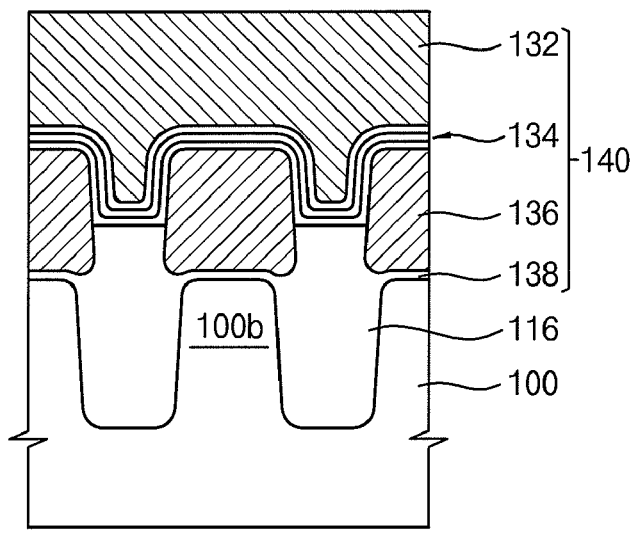
Figure 12:
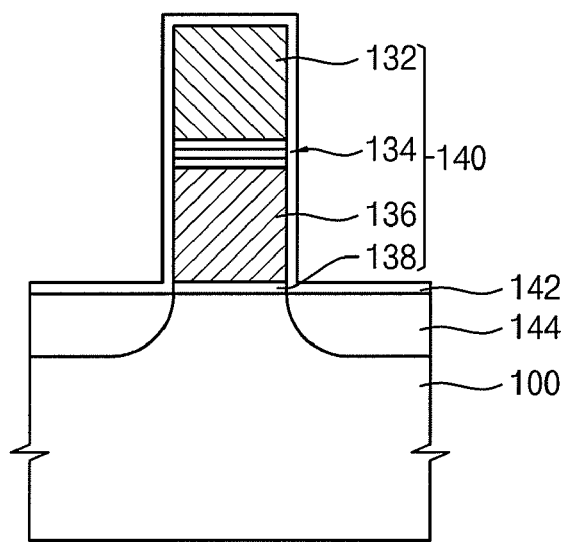

FIGS. 2 to 6 and FIGS. 7 to 11 are cross-sectional views taken along a word line of the non-volatile memory device in accordance with an exemplary embodiment of the present invention, and FIG. 12 is a cross-sectional view taken along a longitudinal direction of an active region of the non-volatile memory device in accordance with an exemplary embodiment of the present invention.

Referring to FIG. 1, a pad oxide layer 102 is formed on a semiconductor device 100 such as a silicon wafer, and a mask layer 104 is formed on the pad oxide layer 102.

The pad oxide layer 102 may be formed on the substrate 100 to a thickness of about 70 Å to about 100 angstroms (Å) by, for example, a thermal oxidation process or a chemical vapor deposition (CVD) process. In addition, the pad oxide layer 102 may be formed at a temperature of about 750° C. to about 900° C. for performing surface treatment of the substrate 100.

The mask layer 104 may comprise, for example, silicon nitride, and is formed on the pad oxide layer 102 to a thickness of about 1,500° C. by, for example, a plasma-enhanced CVD (PECVD) process or a low pressure CVD (LPCVD) process using a source gas including, for example, dichlorosilane ($SiH_2Cl_2$) gas, silane ($SiH_4$) gas and ammonia ($NH_3$) gas.

Figure 2:
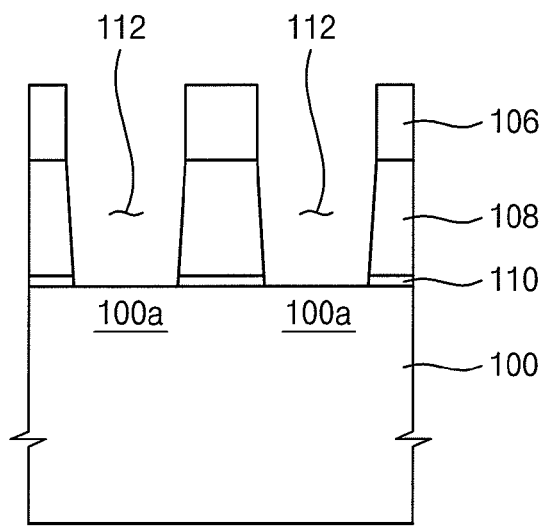

Referring to FIG. 2, a photoresist pattern 106 is formed on the mask layer 104 by, for example, a photolithography process in such a manner that the mask layer 104 is partially exposed through the photoresist pattern 106. Then, the mask layer 104 and the pad oxide layer 102 are sequentially removed from the substrate 100 by, for example, an etching process using the photoresist pattern 106 as an etching mask, to thereby form an oxide pattern 110 and a mask pattern 108 that are sequentially stacked on the substrate 100. The oxide pattern 110 and the mask pattern 108 define a first opening 112 through which a device isolation region 100a of the substrate 100 is exposed.

The etching process may include, for example, a dry etching process and a reactive ion etching process. The photoresist pattern may be removed from the mask pattern 108 by, for example, an ashing process and a strip process after the patterning process for the mask pattern 108 and the oxide pattern 110.

Figure 3:
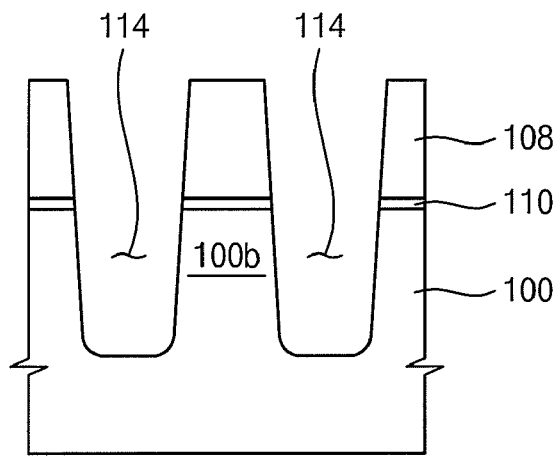

Referring to FIG. 3, the device isolation region 100a of the substrate 100 is etched off by an etching process using the mask pattern 108 as an etching mask, to thereby form a trench 114 extending in a first direction across the substrate 100. As an exemplary embodiment, the trench 114 may be formed to a depth of about 1,000 Å to about 5,000 Å from a top surface of the substrate 100.

High energy ions may cause damage to a silicon structure of the substrate 100 in the etching process for forming the trench 114, and the damage to the silicon structure may cause a leakage current in the substrate 100. To prevent the damage to the silicon structure and the leakage current, a thermal oxidation treatment may be performed on an inner surface of the trench 114. As a result of the thermal oxidation process, a trench oxide layer may be formed on the inner surface of the trench 114 to a thickness of about 50 Å to about 250 Å.

A nitride liner may be formed on the trench oxide layer to a thickness of about 50 Å to about 100 Å, so that impurities such as carbon (C) and hydrogen (H) in a field isolation layer may be prevented from being diffused into an active region 100b of the substrate 100 defined by the trench 114.

As another exemplary embodiment, the trench 114 may be formed on the substrate 100 by another etching process using the photoresist pattern as an etching mask.

Figure 4:
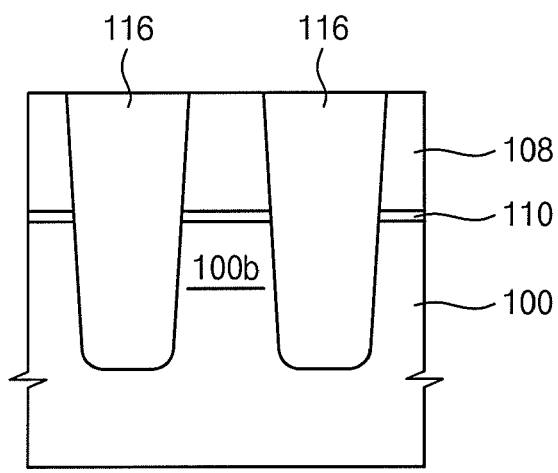

Referring to FIG. 4, a field isolation layer is formed on the substrate 100 to a sufficient thickness to fill up the trench 114. The field isolation layer may include, for example, a silicon oxide layer such as an undoped silicate glass (USG) layer, a tetraethyl orthosilicate (TEOS) layer or a high-density plasma (HDP) oxide layer. In the present exemplary embodiment, the field isolation layer is formed by an HDP process in which silane ($SiH_4$), oxygen ($O_2$) and argon (Ar) gases are used as a plasma source gas.

Then, the field isolation layer may be partially removed from the substrate 100 by a planarization process, such as, for example, a chemical mechanical polishing (CMP) process, until a top surface of the mask pattern 108 is exposed, so that the field isolation layer remains only in the trench 114 to thereby form a field isolation pattern 116 that defines the active region 100b of the substrate 100. A plurality of conductive structures, such as, for example, unit devices of a memory device, is formed on the active region 100b of the substrate 100, and adjacent conductive structures on neighboring active regions are electrically isolated from each other by the field isolation pattern 116. For that reason, the field isolation pattern 116 may be called a device isolation layer.

Figure 5:
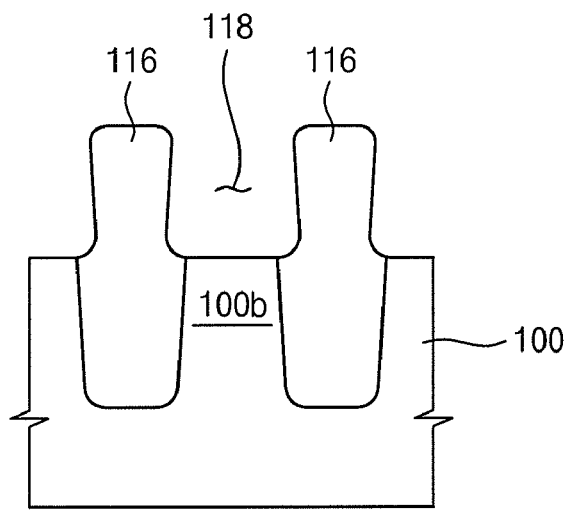

Referring to FIG. 5, the mask pattern 108 and the pad oxide pattern 110 are removed from the substrate 100, to thereby form a second opening 118 through which the active region 100b of the substrate 100 is exposed. For example, the mask pattern 108 may be removed by a wet etching process using a solution including phosphoric acid as an etchant, and the pad oxide pattern 110 may be removed by a wet etching process using a diluted hydrofluoric (HF) acid solution as an etchant. The field isolation pattern 116 may also be partially removed from the substrate 100 during the etching process for removing the mask pattern 108 and the pad oxide pattern 110.

Figure 6:
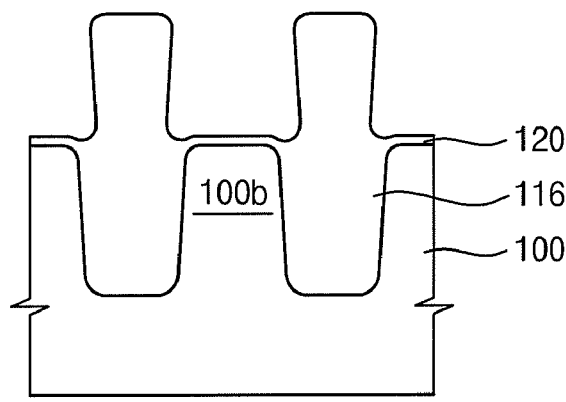

Referring to FIG. 6, a tunnel isolation layer 120 may be formed on the active region 100b of the substrate 100. As an exemplary embodiment, the tunnel isolation layer 120 may comprise silicon oxynitride, and may be formed to a thickness of about 30 Å to about 150 Å.

An oxynitridation treatment may be used for the tunnel isolation layer 120. For example, an oxidation treatment and a nitridation treatment may be simultaneously performed using a first process gas including oxygen ($O_2$) gas and nitrogen ($N_2$) gas for forming the tunnel isolation layer 120. The first process gas includes an oxidation gas such as, for example, oxygen ($O_2$), ozone ($O_3$) and water vapor ($H_2O$), and a nitridation gas such as nitrogen ($N_2$), ammonia ($NH_3$), nitric oxide (NO) and nitrous oxide ($N_2O$).

As an exemplary embodiment, the tunnel isolation layer 120 may be formed by a thermal oxynitridation process in a batch type apparatus for heat treatment. For example, the thermal oxynitridation process may be performed at a temperature of about 800° C. to about 1,100° C. and at atmospheric pressure using oxygen ($O_2$) gas and nitric oxide (NO) gas. For example, the thermal oxynitridation process may be performed at a temperature of about 800° C. to about 950° C., and the flux ratio between oxygen ($O_2$) gas and nitric oxide (NO) is in a range of about 1:0.01 to about 1:0.2. In the present exemplary embodiment, the thermal oxynitridation process is performed at a temperature of about 900° C. for about 25 minutes using an oxygen ($O_2$) gas of about 10 liters and a nitric oxide (NO) gas of about 0.7 liters, and a silicon oxynitride layer is formed on the active region 100b of the substrate 100 to a thickness of about 75 Å.

As another exemplary embodiment of the present invention, the tunnel isolation layer 120 may be formed by a radical oxynitridation treatment using oxygen radicals (O*) and nitrogen radicals (N*). The radical oxynitridation treatment may be performed in, for example, a batch type or a single wafer type processing apparatus using the first process gas exemplarily including oxygen ($O_2$) gas, nitric oxide (NO) gas and hydrogen ($H_2$) gas. The processing apparatus includes a plasma source, such as, for example, a remote plasma generator using microwave energy or a modified magnetron type (MMT) plasma generator using a radio frequency (RF) power source.

The radical oxynitridation treatment may be performed at a temperature of about 800° C. to about 1,100° C. and at a pressure of about 1 mTorr to about 10 Torr, and more particularly, at a temperature of about 800° C. to about 950° C. In the present exemplary embodiment, the radical oxynitridation treatment may be performed at a temperature of about 900° C.

The flux ratio of hydrogen ($H_2$) gas with respect to the first process gas may be in a range of about 10% to about 33%, and the flux ratio of nitric oxide (NO) gas with respect to the first process gas may be in a range of about 1% to about 20%.

Figure 7:
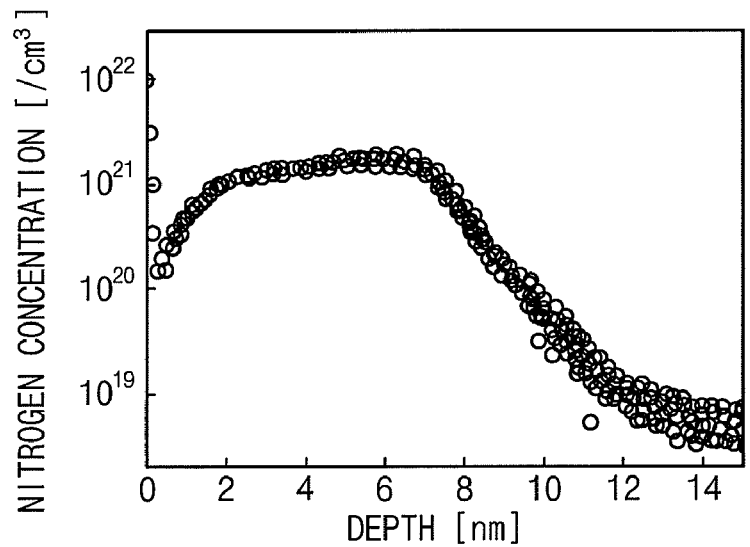
FIG. 7 is a graph showing a profile of nitrogen (N) concentration in the tunnel oxide layer of FIG. 6.

FIG. 7 is a graph showing a profile of nitrogen (N) concentration in the tunnel oxide layer of FIG. 6.

Referring to FIG. 7, the nitrogen (N) concentration profile is uniform in the tunnel oxide layer because the oxidation treatment and the nitridation treatment are simultaneously performed, to thereby improve the dielectric constant of the tunnel oxide layer and prevent the leakage current through the tunnel oxide layer. Accordingly, a non-volatile memory device including the tunnel isolation layer 120 may have improved operation characteristics such as, for example, data maintenance characteristics, thermal resistance and device reliability.

A plurality of defect sites may be generated in the tunnel isolation layer 120 during the formation process of the tunnel isolation layer 120. For example, the tunnel isolation layer 120 may include strained Si—O bonds, unstable Si—H bonds and silicon dangling bonds. The above operational characteristics of the non-volatile memory device may be deteriorated at the defect sites of the tunnel oxide layer caused by the strained Si—O bonds, unstable Si—H bonds and silicon dangling bonds. So to prevent the generation of the defect sites, a first heat treatment is performed on the tunnel oxide layer 120.

The first heat treatment may be performed in a gas atmosphere including nitrogen (N). For example, the first heat treatment may be performed in a gas atmosphere including $N_2$, NO, $N_2O$, $NH_3$, etc. In the present exemplary embodiment, the first heat treatment is performed using a second process gas including nitrogen ($N_2$) gas and nitric oxide (NO) gas. The flux ratio of the nitrogen ($N_2$) gas and the nitric oxide (NO) gas may be in a range of about 1:0.01 to about 1:0.2. The first heat treatment may be performed in, for example, a batch type apparatus for heat treatment at a temperature of about 800° C. to about 1,100° C. and at atmospheric pressure. More particularly, the first heat treatment may be performed at a temperature of about 800° C. to about 950° C.

In the present exemplary embodiment, the first heat treatment is performed at a temperature of about 900° C. for about 10 minutes, and about 9.3 liters of nitrogen ($N_2$) gas and about 0.7 liters of nitric oxide (NO) gas are provided into the batch type heat treatment apparatus during the first heat treatment.

Further, the first heat treatment may be performed in-situ with the oxynitridation process for the tunnel isolation layer 120.

The silicon dangling bonds may be removed from the tunnel isolation layer 120 by the first heat treatment, and the first heat treatment may replace the unstable Si—H bonds with stable Si—N bonds.

A second heat treatment may be further performed after completion of the first heat treatment, so that residual defect sites may be removed from the tunnel isolation layer 120. The second heat treatment may be performed in a gas atmosphere including HCl and oxidants such as $O_2$, $O_3$ and $H_2O$. Therefore, the defects in the tunnel isolation layer 120 may be removed by the first heat treatment, and residual defect sites at a surface of the tunnel isolation layer 120 and at a boundary surface between the tunnel isolation layer 120 and the substrate 100 may be removed by the second heat treatment.

For example, the second heat treatment may be performed using a third process gas including oxygen ($O_2$) and hydrogen chloride (HCl). The flux ratio of oxygen ($O_2$) gas and hydrogen chloride (HCl) is in a range of about 1:0.001 to about 1:0.1. The second heat treatment may be performed at a temperature of about 800° C. to about 1,100° C. in a batch type heat treatment apparatus. More particularly, the second heat treatment may be performed at a temperature of about 800° C. to about 950° C.

In the present exemplary embodiment, the second heat treatment may be performed at a temperature of about 900° C. for about 15 minutes, and about 10 liters of oxygen ($O_2$) gas and about 0.1 liters of hydrogen chloride (HCl) gas are provided into the batch type heat treatment apparatus. The thickness of the tunnel isolation layer 120 may be increased to about 2 Å to about 5 Å by the second heat treatment.

The second heat treatment may be performed in-situ with the first heat treatment.

The residual defect sites may be sufficiently removed from the tunnel isolation layer 120 by the second heat treatment. For example, stable Si—Cl bonds may be replaced with the unstable Si—H bonds and residual silicon dangling bonds are removed from the tunnel isolation layer 120.

Figure 8:
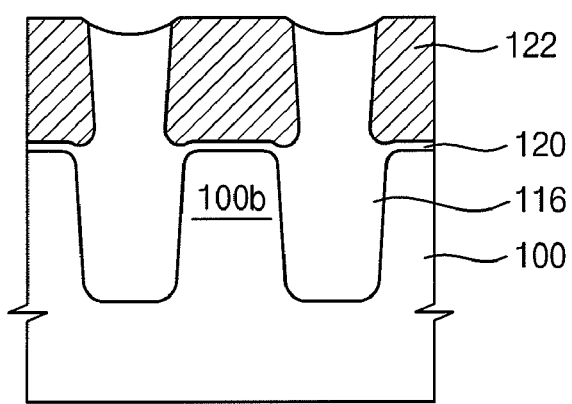

Referring to FIG. 8, a floating gate conductive layer is formed on the tunnel isolation layer 120 and the field isolation pattern 116 to a sufficient thickness to fill up the second opening 118. The floating gate conductive layer may comprise, for example, polysilicon doped with impurities and is formed at a temperature of about 580° C. to about 620° C. using silane ($SiH_4$) gas and phosphine ($PH_3$) gas.

Then, the floating gate conductive layer is removed from the substrate 100 by, for example, a planarization process, such as an etch-back process or a CMP process, until a top surface of the field isolation pattern 116 is exposed, to thereby form a floating gate pattern 122 in the second opening 118. The field isolation pattern 116 may also be partially removed from the substrate 100 in the planarization process.

As another example exemplary embodiment, the tunnel isolation layer and the floating gate conductive layer are sequentially formed on the substrate 100 and a patterning process is performed on the floating gate conductive layer, to thereby form the floating gate conductive layer into the floating gate conductive pattern. The patterning process for forming the floating gate conductive pattern is performed as follows.

At first, the tunnel isolation layer is formed on the substrate 100 by the oxynitridation treatment, and the first and second heat treatments are performed on the tunnel isolation layer 120. The oxynitridation treatment and the first and second heat treatments are substantially the same process as described with reference FIGS. 6 and 7, and thus any further detailed descriptions of the oxynitridation treatment and the first and second heat treatments are omitted.

After completion of the second heat treatment, the floating gate conductive layer is formed on the tunnel isolation layer. A mask pattern, which may comprise, for example, an oxide or a nitride, is formed on the floating gate conductive layer, and an anisotropic etching process is performed on the floating gate conductive layer using the mask pattern as an etching mask. As a result, the floating gate conductive pattern is formed on the substrate. The anisotropic etching process using the mask pattern as an etching mask continuously advances to the tunnel isolation layer and the substrate, to thereby form a trench defining an active region of the substrate. Then, a field isolation layer is formed on the substrate to a sufficient thickness to fill up the trench, and a planarization process is performed on the field isolation layer until a top surface of the floating gate conductive pattern is exposed.

Figure 9:
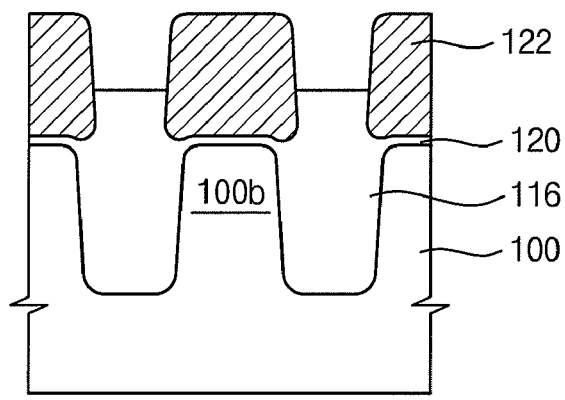

Referring to FIG. 9, an upper portion of the field isolation pattern 116 is removed from the substrate 100, to thereby expose an upper sidewall of the floating gate pattern 122. The upper portion of the field isolation pattern 116 is removed by, for example, an isotropic or an anisotropic etching process in such a manner that the tunnel oxide layer 120 on the active region 100b of the substrate 100 is not exposed. Therefore, the tunnel isolation layer 120 may be prevented from being damaged by an etchant or an etching gas for partially etching the field isolation pattern 116. In addition, a corner portion of the floating gate conductive pattern 122 may be rounded in the etching process for removal of the field isolation pattern 116.

Referring to FIG. 10, a blocking layer 124 may be formed on the floating gate conductive pattern 122 and the field isolation pattern 116. For example, the blocking layer 124 may include a lower silicon oxide layer 126, a silicon nitride layer 128 and an upper silicon oxide layer 130.

The lower silicon oxide layer 126 may be formed on the floating gate conductive pattern 122 and the field isolation pattern 116 to a thickness of about 30 Å to about 150 Å by, for example, a middle temperature oxide (MTO) deposition process or an HDP deposition process.

The silicon nitride layer 128 may be formed on the lower silicon oxide layer 126 to a thickness of about 30 Å to about 150 Å by, for example, an LPCVD process.

The upper silicon oxide layer 130 may be formed on the floating gate conductive pattern 128 to a thickness of about 30

Å to about 150 Å by, for example, an MTO deposition process or an HDP deposition process.

As another exemplary embodiment of the present invention, the blocking layer 124 may include a lower silicon oxide layer, a metal oxide layer and an upper silicon oxide layer. The metal oxide layer may be formed on the lower silicon oxide layer to a thickness of about 20 Å to about 100 Å by, for example, an atomic layer deposition (ALD) process or a CVD process, and a dielectric constant of the metal layer is greater than that of the silicon nitride layer. The metal oxide layer may comprise, for example, any one of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu). For example, the metal oxide layer may include hafnium oxide ($HfO_2$), zirconium oxide ($ZrO_2$), aluminum oxide ($Al2O_3$), hafnium aluminum oxide (HfAlO), lanthanum oxide ($La_2O_3$), hafnium lanthanum oxide (HfLaO) and aluminum lanthanum oxide (AlLaO).

As still another exemplary embodiment of the present invention, the blocking layer 124 may include a lower dielectric layer, a middle dielectric layer and an upper dielectric layer. The middle dielectric layer may comprise a material of which an energy band gap is greater than that of the lower dielectric layer, and the upper dielectric layer may comprise substantially the same material as the lower dielectric layer. For example, the lower dielectric layer may include an aluminum oxide layer, and the middle dielectric layer includes a hafnium oxide layer or a zirconium oxide layer.

Referring to FIG. 11, a control gate conductive layer may be formed on the blocking layer 124. The control gate conductive layer may comprise conductive materials such as, for example, polysilicon doped with impurities, metal and metal silicide. For example, the control gate conductive layer may include a doped polysilicon layer and a metal layer or a metal silicide layer on the doped polysilicon layer. The metal layer may comprise, for example, tungsten (W), and the metal silicide layer may comprise tungsten silicide ($WSi_x$), titanium silicide ($TiSi_x$), cobalt silicide ($CoSi_x$), tantalum silicide ($TaSi_x$), etc.

As another exemplary embodiment of the present invention, the control gate conductive layer may include a doped polysilicon layer, an ohmic layer, a barrier metal layer and a metal layer. A metal silicide layer may be used as the ohmic layer, and a metal nitride layer may be used as the barrier metal layer.

Then, the control gate conductive layer, the blocking layer 124, the floating gate pattern 122 and the tunnel isolation layer 120 are sequentially patterned, to thereby form a gate structure 140 on the active region 100b of the substrate 100 along a second direction different from the first direction. For example, the second direction may be substantially perpendicular to the first direction. The patterning process for forming the gate structure 140 is performed until the active region 100b is exposed.

The gate structure 140 includes a control gate electrode 132, a blocking pattern 134, a floating gate electrode 136 and the tunnel isolation pattern 138. The control gate electrode 132 may include a polysilicon pattern and a metal pattern. For example, the metal pattern may function as a word line for a semiconductor device.

As an exemplary embodiment, the gate structure 140 may be formed by an anisotropic etching process. For example, a photoresist pattern may be formed on the control gate conductive layer and a reactive ion etching process is performed on the control gate conductive layer using the photoresist pattern as an etching mask, to thereby form the gate structure 140.

As another exemplary embodiment of the present invention, a mask pattern comprising an oxide or a nitride is formed on the control gate conductive layer and an etching process is performed on the control gate conductive layer, to thereby form the gate structure 140.

The reactive etching process may cause damage to a surface of the gate structure 140 and a surface of the substrate 100. That is, a plurality of defect sites may be generated at the surface of the gate structure 140 in the reactive etching process. For example, defects such as silicon dangling bonds and unstable Si—O bonds and Si—H bonds may be intensively generated at edge portions of the tunnel isolation pattern 138. The above defect sites may function as trap sites for electrons or holes in a programming operation or an erasing operation of the non-volatile memory device, to thereby deteriorate the data maintenance characteristics and reliability of the non-volatile memory device. For that reason, a re-oxidation process may be performed on the surface of the gate structure 140 and the substrate 100, to thereby cure the damage to the gate structure 140. An oxide layer 142 may be formed on the surface of the gate structure 140 and the substrate 100 after the re-oxidation process.

Referring to FIG. 12, source/drain regions 144 may be formed at surface portions of the substrate 100 adjacent to the gate structure 140, to thereby complete the non-volatile memory device in accordance with an exemplary embodiment of the present invention. The source/drain regions 144 may be formed on the substrate 100 by, for example, an ion implantation process and a heat treatment for activating impurities at the surface portions of the substrate 100. In addition, a spacer may be further formed at a sidewall of the gate structure 140 before forming the source/drain regions 144.

FIGS. 13 to 17 are cross-sectional views illustrating a method of manufacturing a non-volatile memory device in accordance with another exemplary embodiment of the present invention.

Figure 13:
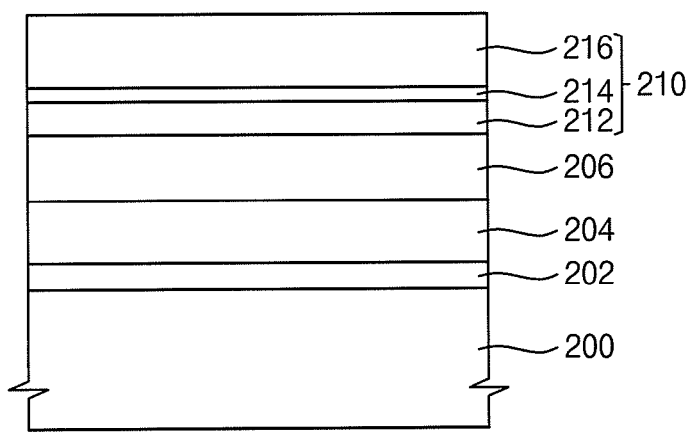
FIGS. 13 to 17 are cross-sectional views illustrating a method of manufacturing a non-volatile memory device in accordance with an exemplary embodiment of the present invention.

Referring to FIG. 13, a device isolation layer is formed on a semiconductor substrate 200, such as a silicon wafer, to thereby form an active region on the substrate 200. For example, a shallow-trench isolation (STI) process or a local oxidation of silicon (LOCOS) process may be performed on a surface of the substrate 200, to thereby form the device isolation layer on the substrate 200.

A tunnel isolation layer 202 comprising, for example, silicon oxynitride may be formed on the substrate 200 by a simultaneous oxidation-and-nitridation process. First and second heat treatments may be performed on the tunnel isolation layer 202, to thereby remove defect sites from the tunnel isolation layer 202. The method of forming the tunnel oxide layer 202 and the first and second heat treatments are substantially the same as described with reference to FIGS. 6 and 7, and thus any further descriptions of the formation of the tunnel oxide layer 202 and the first and second heat treatments are omitted.

After the second heat treatment, a trapping layer 204, a blocking layer 206 and a conductive layer 210 are formed on the tunnel isolation layer 202.

The trapping layer 204 may comprise, for example, silicon nitride such as $Si_3N_4$, and may trap electrons from the channel region of the substrate 200.

The trapping layer 204 may be formed on the tunnel isolation layer 202 to a thickness of about 20 Å to about 100 Å by, for example, an LPCVD process. In the present embodiment, the trapping layer 204 is formed on the tunnel isolation layer 202 to a thickness of about 60 Å.

The trapping layer 204 may comprise a material of high dielectric constant greater than that of silicon nitride. For example, the material of high dielectric constant may include a metal oxide, a metal oxynitride, a metal silicon oxide, a metal silicon oxynitride. For example, the high dielectric material may include hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

For example, a silicon-rich silicon oxide layer and a silicon nanocrystal layer may be used as the trapping layer 204. The silicon-rich silicon oxide layer and the silicon nanocrystal layer are formed on the tunnel isolation layer 202 by an ALD process. For example, the silicon-rich silicon oxide layer may be formed by an ALD process using hexachlorodisilane ($Si_2Cl_6$) gas as a source gas and nitrous oxide ($N_2O$) gas or oxygen ($O_2$) gas as an oxidizer, and the silicon nanocrystal layer may be formed by an ALD process using silane ($SiH_4$) gas as a source gas. The trapping layer 204 may have a laminate structure in which a plurality of the silicon-rich silicon oxide layers and a plurality of the silicon nanocrystal layers may be alternately stacked on each other.

Then, a blocking layer 206 may be formed on the trapping layer 204. The blocking layer 206 electrically isolates the trapping layer 204 from a conductive layer 210. For example, the blocking layer 206 may comprise aluminum oxide, and may be formed on the trapping layer 204 to a thickness of about 100 Å to about 400 Å by a CVD process or an ALD process. In the present exemplary embodiment, the blocking layer 206 is formed on the trapping layer 204 to a thickness of about 200 Å.

As another exemplary embodiment, the blocking layer 206 may comprise a high dielectric material of which a dielectric constant is greater than those of silicon oxide, silicon oxynitride and silicon nitride. For example, the blocking layer 206 may comprise a metal oxide, a metal oxynitride, a metal silicon oxide, or a metal silicon oxynitride. The blocking layer 206 may comprise, for example, hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu). Particularly, the blocking layer may include a hafnium aluminum oxide (HfAlO) layer, a lanthanum oxide ($La_2O_3$) layer, a hafnium lanthanum oxide (HfLaO) layer and an aluminum lanthanum oxide (AlLaO) layer.

A conductive layer 210 is formed on the blocking layer 206. The conductive layer 210 may include a first conductive layer 212, a glue layer 214 and a second conductive layer 216.

The first conductive layer 212 may be formed on the blocking layer 206 to a thickness of about 100 Å to about 400 Å. In the present exemplary embodiment, the first conductive layer 212 is formed on the blocking layer 206 to a thickness of about 200 Å by a CVD process, an ALD process or a PVD process.

For example, the first conductive layer 212 may comprise a material of which a work function is more than about 4 eV, and includes titanium (Ti), titanium nitride (TiN), tantalum (Ta), tantalum nitride (TaN), tungsten (W), tungsten nitride (WN), hafnium (Hf), niobium (Nb), molybdenum (Mo), molybdenum nitride ($MO_2N$), ruthenium monoxide (RuO), ruthenium dioxide ($RuO_2$), iridium (Ir), iridium oxide ($IrO_2$), platinum (Pt), cobalt (Co), chromium (Cr), titanium aluminum ($Ti_3Al$), titanium aluminum nitride ($Ti_2AlN$), palladium (Pd), tungsten silicide (WSi), nickel silicide (NiSi), cobalt silicide (CoSi), tantalum silicide (TaSi), etc.

A subsequent process may be further performed so as to increase the work function of the first conductive layer 212. For example, a heat treatment, a plasma treatment, or an ion implantation process may be further performed on the first conductive layer 212. The subsequent process may be performed on the first conductive layer 212 using a material of which chemical elements are different from those of the first conductive layer 212. For example, the subsequent process may be performed using a gas including elements in Groups 2 and 13 to 18 in the periodic table. For example, the subsequent process may be performed using a gas including any one of nitrogen (N), oxygen (O), fluorine (F), neon (Ne), helium (He), phosphorus (P), sulfur (S), chlorine (Cl), argon (Ar), arsenic (As), selenium (Se), bromine (Br), kryptron (Kr), antimony (Sb), tellurium (Te), iodine (I), xenon (Xe) and combinations thereof.

As an exemplary embodiment, the glue layer 214 is formed on the first conductive layer 212 to a thickness of about 50 Å, and comprises a metal nitride such as tungsten nitride, titanium nitride, and tantalum nitride.

As an exemplary embodiment, the second conductive layer 216 is formed on the glue layer 214 to a thickness of about 300 Å. For example, the second conductive layer 216 may comprise a metal such as tungsten (W) or a metal silicide such as tungsten silicide, tantalum silicide, cobalt silicide and titanium silicide.

Figure 14:
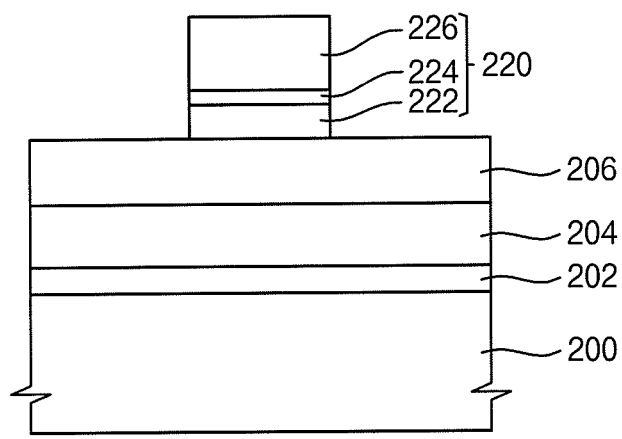

Referring to FIG. 14, a photoresist pattern may be formed on the conductive layer 210 by, for example, a photolithography process.

The conductive layer 210 is patterned by, for example, an anisotropic etching process using the photoresist pattern as an etching mask, to thereby form a gate structure 220 on the blocking layer 206. The gate structure 220 includes a first conductive pattern 222, a glue pattern 224 and a second conductive pattern 226. For example, the first conductive pattern 222 may function as a gate electrode, and the second conductive pattern 226 may function as a word line.

The photoresist pattern may be removed from the gate structure 220 by, for example, an ashing process and a stripping process.

Figure 15:
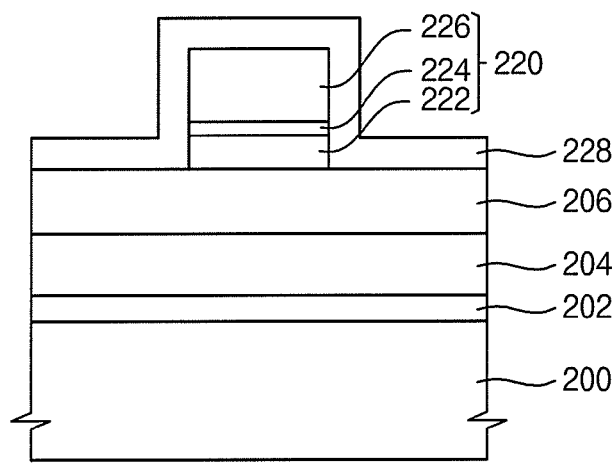

Referring to FIG. 15, a spacer layer 228 may be formed on the gate structure 220 and the blocking layer 206. For example, the spacer layer 228 may comprise silicon oxide or silicon nitride.

Figure 16:
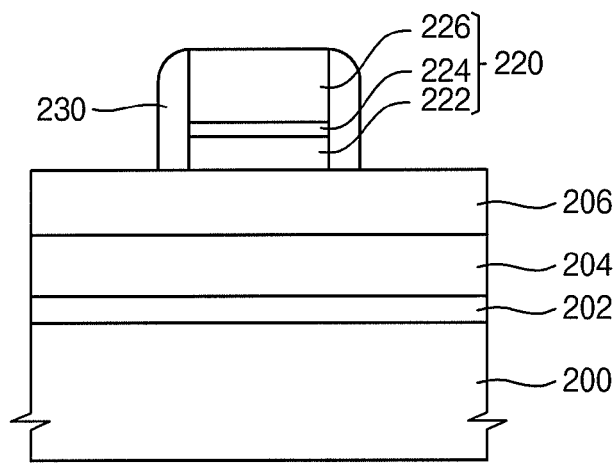

Referring to FIG. 16, an anisotropic etching process is performed on the spacer layer 228, to thereby form a spacer 230 on a sidewall of the gate structure 220.

Figure 17:
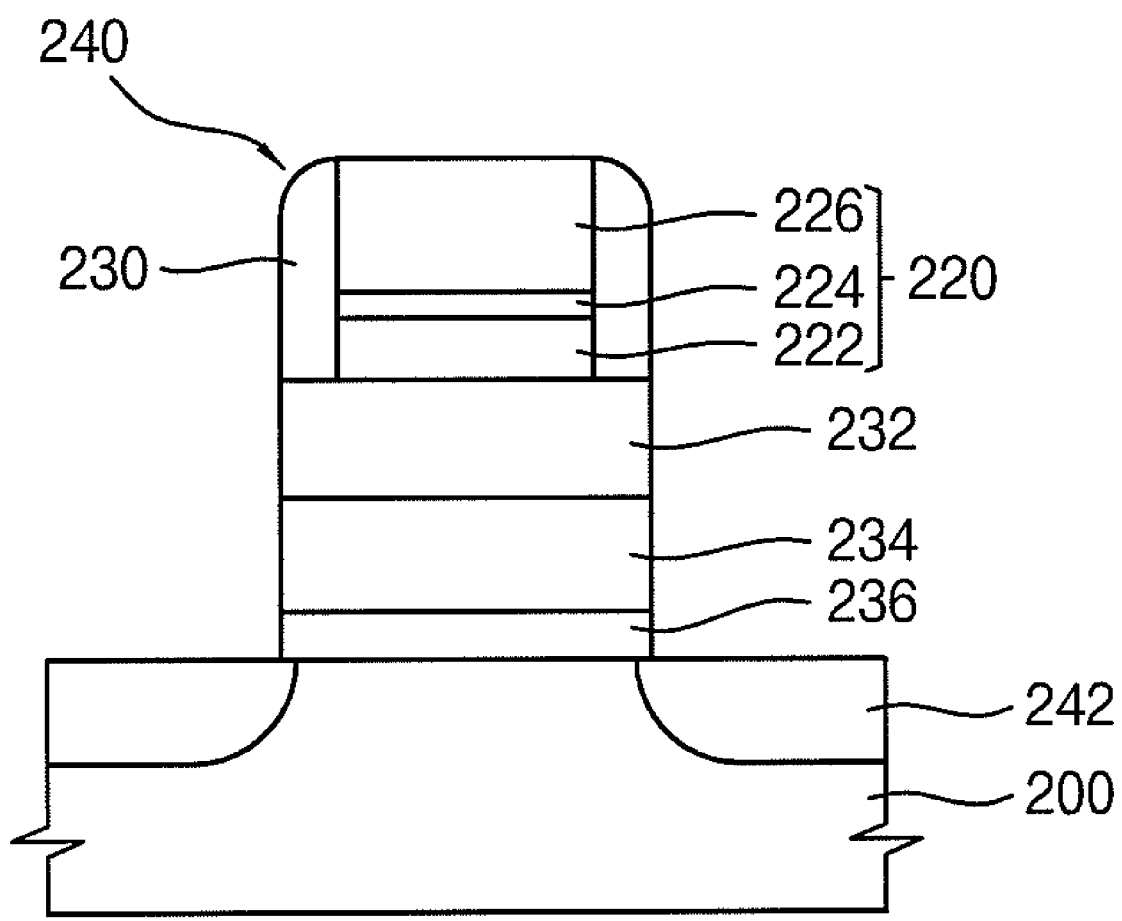

Referring to FIG. 17, the blocking layer 206, the trapping layer 204 and the tunnel isolation layer 202 are sequentially removed from the substrate 200 by, for example, an anisotropic etching process using the gate structure 220 and the spacer 230 as an etching mask, to thereby form a blocking pattern 232, a trapping pattern 234 and a tunnel isolation pattern 236 on the substrate 200.

As a result, the tunnel isolation pattern 236, the trapping pattern 234, the blocking pattern 232 and the gate structure 220 including the spacer 230 are sequentially stacked on the channel region 200a of the substrate 200, to thereby form a gate electrode 240 on the substrate 200.

The etching process for forming the blocking pattern 232, the trapping pattern 234 and the tunnel isolation pattern 236 may cause damage to the substrate 200 and the gate structure 230, so that a re-oxidation process may be further performed on the substrate 200 and the gate structure 230 so as to cure the damage to the substrate 200 and the gate structure 230.

Source/drain regions 242 may be formed at surface portions of the substrate 200 adjacent to the gate electrode 240 by, for example, an ion implantation process using the gate electrode 240 as an implantation mask and a heat treatment for diffusing the implanted ions.

According to an exemplary embodiment of the present invention, a tunnel isolation layer for a non-volatile memory device is formed by an oxynitridation process, to thereby improve electrical characteristics of the tunnel isolation layer such as a dielectric constant and a leakage current. Further, defect sites of the tunnel isolation layer may be removed by first and second heat treatments thereto, to thereby sufficiently improve data maintenance characteristics, high temperature resistance and data reliability in the non-volatile memory device.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a non-volatile memory device, comprising:
    forming a tunnel isolation layer comprising an oxynitride on a substrate by a simultaneous oxidation and nitridation treatment in which an oxidation process and a nitridation process are simultaneously performed using a processing gas including oxygen and nitrogen;
    performing a first heat treatment in a first gas atmosphere including nitrogen (N), to thereby remove defect sites from the tunnel isolation layer;
    performing a second heat treatment in a second gas atmosphere including chlorine (Cl), to thereby remove residual defect sites remaining after the first heat treatment from the tunnel isolation layer;
    forming a gate structure on the tunnel isolation layer after the second heat treatment; and
    forming source/drain regions at surface portions of the substrate adjacent to the gate structure.

2. The method of claim 1, wherein the processing gas includes one selected from the group consisting of oxygen ($O_2$), ozone ($O_3$) and water vapor ($H_2O$), and includes one selected from the group consisting of nitrogen ($N_2$), ammonia ($NH_3$), nitric oxide (NO) and nitrous oxide ($N_2O$).

3. The method of claim 2, wherein the processing gas includes oxygen ($O_2$) and nitric oxide (NO).

4. The method of claim 3, wherein a flux ratio of the oxygen ($O_2$) and the nitric oxide (NO) is in a range of about 1:0.01 to about 1:0.2.

5. The method of claim 3, wherein the processing gas further includes hydrogen ($H_2$) gas.

6. The method of claim 1, wherein the simultaneous oxidation and nitridation treatment is performed at a temperature of about 800° C. to about 1,100° C.

7. The method of claim 1, wherein the simultaneous oxidation and nitridation treatment is performed using oxygen radicals and nitrogen radicals.

8. The method of claim 1, wherein the first gas atmosphere for the first heat treatment includes one selected from the group consisting of nitrogen ($N_2$), nitric oxide (NO), nitrous oxide ($N_2O$) and ammonia ($NH_3$).

9. The method of claim 8, wherein the first heat treatment is performed using a second processing gas including nitrogen ($N_2$) and nitric oxide (NO).

10. The method of claim 9, wherein a flux ratio of the nitrogen ($N_2$) and nitric oxide (NO) is in a range of about 1:0.01 to about 1:0.2.

11. The method of claim 1, wherein the first heat treatment is performed at a temperature of about 800° C. to about 1,100° C.

12. The method of claim 1, wherein the second gas atmosphere for the second heat treatment includes hydrogen chloride (HCl) and one selected from the group selected from the group consisting oxygen ($O_2$), ozone ($O_3$) and water vapor ($H_2O$).

13. The method of claim 12, wherein the second heat treatment is performed using a second processing gas including oxygen ($O_2$) and hydrogen chloride (HCl).

14. The method of claim 13, wherein a flux ratio of the oxygen ($O_2$) and the hydrogen chloride (HCl) is in a range of about 1:0.001 to about 1:0.1.

15. The method of claim 1, wherein the second heat treatment is performed at a temperature of about 800° C. to about 1.100° C.

16. The method of claim 1, wherein the step of performing the first heat treatment and the step of forming the tunnel isolation layer are performed in-situ with each other.

17. The method of claim 1, wherein the step of performing the first heat treatment and the step of performing the second heat treatment are performed in-situ with each other.

18. The method of claim 1, wherein the step of forming the tunnel isolation layer, the step of performing the first heat treatment and the step of performing the second heat treatment are performed in-situ with one another.

19. The method of claim 1, wherein the forming of the gate structure includes:
    forming a floating gate pattern on the tunnel isolation layer on which the second heat treatment is performed;
    forming a blocking layer on the floating gate pattern;
    forming a control gate conductive layer on the blocking layer; and
    sequentially patterning the control gate conductive layer, the blocking layer, the floating gate pattern and the tunnel isolation layer.

20. The method of claim 19, wherein the blocking layer includes a lower dielectric layer, a middle dielectric layer and an upper dielectric layer.

21. The method of claim 20, wherein the lower and upper dielectric layers include silicon oxide, respectively, and the middle dielectric layer includes one of silicon nitride or a metal oxide having a dielectric constant greater than the silicon nitride.

22. The method of claim 21, wherein the metal oxide includes at least one metal selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

23. The method of claim 1, wherein the forming of the gate structure includes:
    forming a trapping layer on the tunnel isolation layer on which the second heat treatment is performed, the trapping layer trapping electrons from a channel region of the substrate;
    forming a blocking layer on the trapping layer;
    forming a conductive layer on the blocking layer; and
    sequentially patterning the conductive layer, the blocking layer, the trapping layer and the tunnel isolation layer.

24. The method of claim 23, wherein the trapping layer includes one of silicon nitride or a first material having a dielectric constant greater than the silicon nitride.

25. The method of claim 24, wherein the first material includes one of a metal oxide, a metal oxynitride, a metal silicon oxide and a metal silicon oxynitride.

26. The method of claim 25, wherein the first material includes at least one selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

27. The method of claim 23, wherein the blocking layer includes a second material of which a dielectric constant is greater than those of silicon oxide, silicon oxynitride and silicon nitride.

28. The method of claim 27, wherein the second material includes one of a metal oxide, a metal oxynitride, a metal silicon oxide and a metal silicon oxynitride.

29. The method of claim 28, wherein the second material includes at least one selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

30. The method of claim 1, wherein the forming of the gate structure includes:
    forming a trapping layer on the tunnel isolation layer on which the second heat treatment is performed, the trapping layer trapping electrons from a channel region of the substrate;
    forming a blocking layer on the trapping layer;
    forming a conductive layer on the blocking layer;
    forming a gate electrode by patterning the conductive layer; and
    sequentially patterning the blocking layer, the trapping layer and the tunnel isolation layer.

31. The method of claim 30, further comprising forming a spacer on a sidewall of the gate electrode, and the step of patterning the blocking layer, the trapping layer and the tunnel isolation layer is performed by an etching process using the spacer as an etching mask.

32. A method of manufacturing a non-volatile memory device, comprising:
    forming an oxide pattern and a mask pattern that are stacked on a substrate;
    forming a trench in the substrate;
    forming a field isolation pattern in the trench located in the substrate;
    removing the oxide pattern and the mask pattern from the substrate by an etching process to thereby form an opening through which an active region of the substrate is exposed;
    forming a tunnel isolation layer comprising an oxynitride on the active region of the substrate by a simultaneous oxidation and nitridation treatment in which an oxidation process and a nitridation process are simultaneously performed using a processing gas including oxygen and nitrogen;
    performing a first heat treatment in a first gas atmosphere including nitrogen (N), to thereby remove defect sites from the tunnel isolation layer;
    performing a second heat treatment in a second gas atmosphere including chlorine (Cl), to thereby remove residual defect sites remaining after the first heat treatment from the tunnel isolation layer;
    forming a gate structure on the tunnel isolation layer after the second heat treatment; and
    forming source/drain regions at surface portions of the substrate adjacent to the gate structure.

33. The method of claim 32, wherein the field isolation pattern is also partially removed from the substrate during the etching process for removing the mask pattern and the pad oxide pattern.

* * * * *